United States Patent [19]

Prevost

[11] Patent Number: 5,101,323
[45] Date of Patent: Mar. 31, 1992

[54] COMPONENT-CONNECTING DEVICE AND FUNCTIONAL MODULE FOR THE USE THEREOF

[75] Inventor: Michel Prevost, Le Plessis Robinson, France

[73] Assignee: Thomson-CSF, Puteaux, France

[21] Appl. No.: 446,808

[22] Filed: Dec. 6, 1989

[30] Foreign Application Priority Data

Dec. 9, 1988 [FR] France .................. 88 16214

[51] Int. Cl.⁵ .......................... H05K 1/14; H05K 7/00
[52] U.S. Cl. ................................. 361/394; 361/393; 361/385; 361/389; 361/414; 361/395; 439/65
[58] Field of Search .............. 361/414, 400, 382, 385, 361/386, 388, 389, 392, 393, 394, 395, 399; 439/65, 66

[56] References Cited

U.S. PATENT DOCUMENTS

| | | | |
|---|---|---|---|
| 3,029,495 | 4/1962 | Doctor | 361/396 |
| 4,202,007 | 5/1980 | Dougherty et al. | 174/264 X |
| 4,434,321 | 2/1984 | Betts | 361/414 X |
| 4,535,388 | 8/1985 | Kraus et al. | 361/414 |
| 4,581,679 | 4/1986 | Smolley | 361/395 |
| 4,755,866 | 7/1988 | Marshall et al. | 361/389 X |
| 4,827,083 | 5/1989 | Inasaka et al. | 174/264 |
| 4,878,846 | 11/1989 | Schroeder | 439/65 |
| 4,942,497 | 7/1990 | Mine et al. | 361/382 |

Primary Examiner—Leo P. Picard
Assistant Examiner—Paramita Ghosh
Attorney, Agent, or Firm—Oblon, Spivak, McClelland, Maier & Neustadt

[57] ABSTRACT

The component-connecting device comprises several stacked and assembled wafers. Each wafer is made of an insulating material and includes conductive tracks that are rectilinear and parallel to one another. The tracks of two adjacent wafers are perpendicular. The tracks of the different wafers are made on a given side of the device. The device has zones for the connection of a component to that face, of the faces bearing the tracks, which is free, and these zones are electrically connected to tracks of other wafers. Finally, the tracks of the different wafers are extended as a connection zone with the exterior.

18 Claims, 4 Drawing Sheets

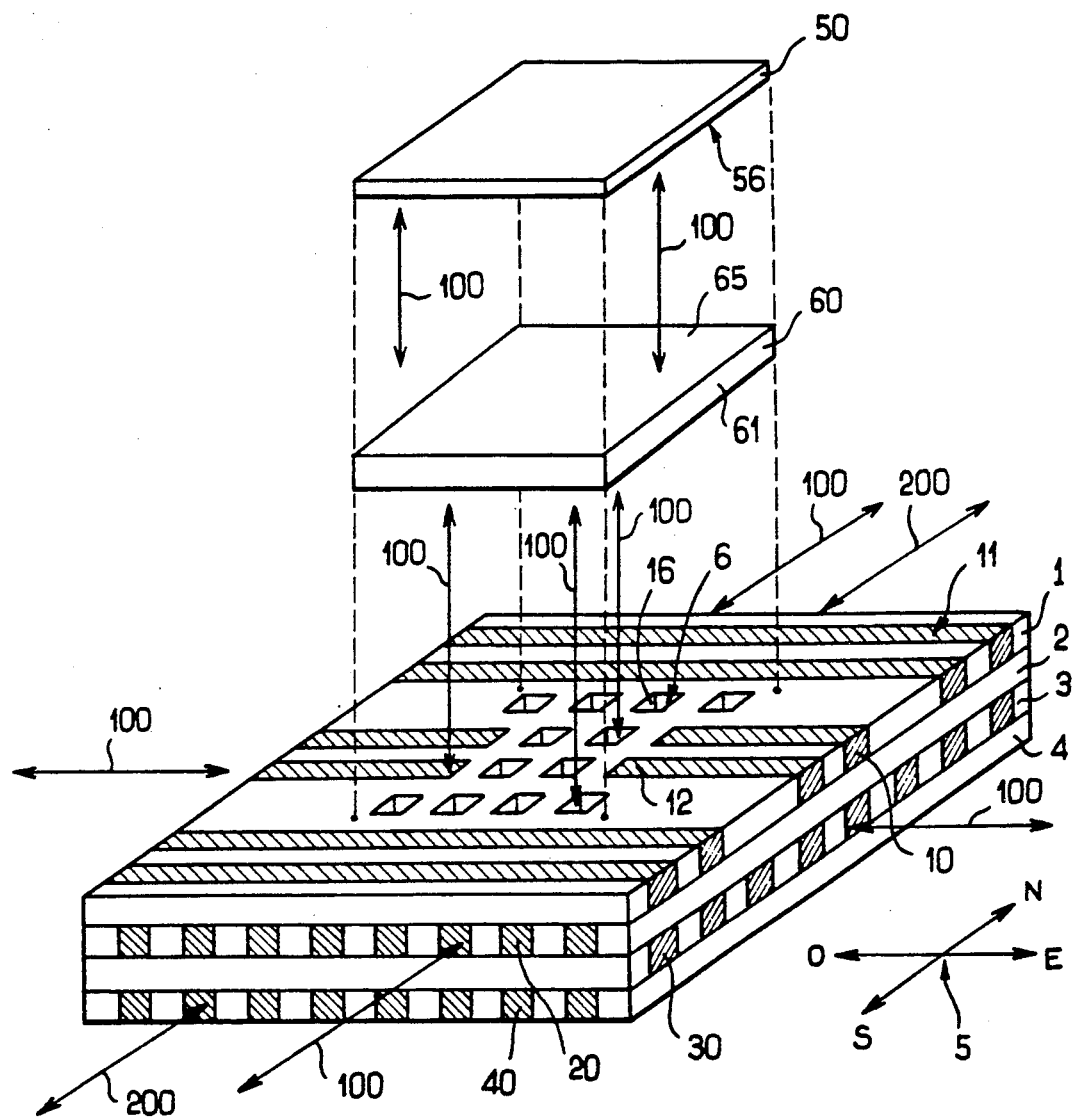
FIG_2

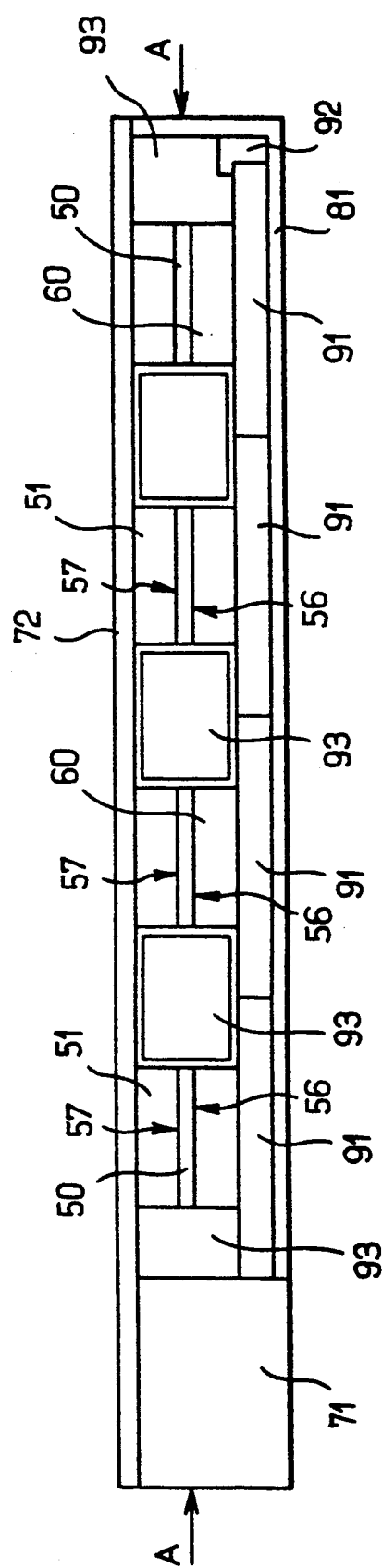
FIG._3

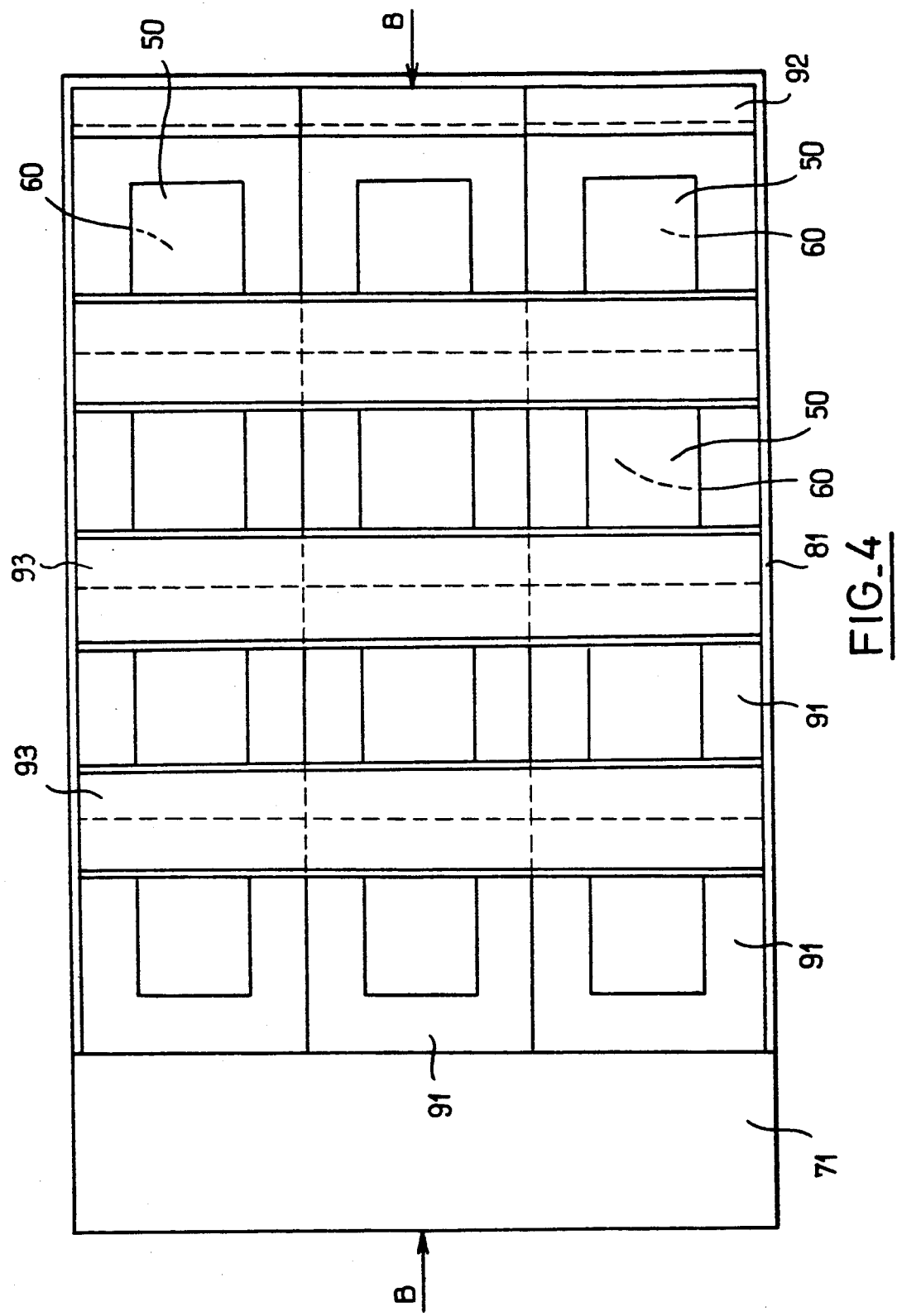
FIG_4

COMPONENT-CONNECTING DEVICE AND FUNCTIONAL MODULE FOR THE USE THEREOF

BACKGROUND OF THE INVENTION

1. Field of the Invention

The object of the present invention is a component-connecting device that is capable of carrying a component and is, for example, designed to be connected to other devices of the same type, which are each capable of carrying a component. The invention also concerns a functional module comprising a plurality of connecting devices such as this.

In the foregoing as well as hereinafter, the general term "component" is used to designate any active or passive component, any discrete component or any set of components forming an integrated circuit, which comprises connection zones placed on at least one part of a substantially plane surface.

To make an electrical circuit, it is necessary to interconnect components. For current equipment, it is sought to make such connections as compactly as possible. It is also useful to make standardized equipment or to achieve a compromise between compactness and standardization, these two results being often antinomial.

2. Description of the Prior Art

Multiple-layer printed cards are known: these are formed by stacked insulating plates assembled on one another. Each plate includes electricity conducting tracks made on at least one face, the tracks of all the wafers being, for example, made on the faces oriented towards the same side of the stack. The tracks of different wafers are interconnected by metallized holes. Components are connected to certain of these tracks, for example by means of metallized holes. Finally, the printed circuit has means for external connection which are known per se.

The number of layers, the pattern of the tracks on each layer and the location of the metallized layers are determined as a function of the application of the printed circuit, i.e. as a function of the desired interconnection.

SUMMARY OF THE INVENTION

An object of the invention is a component-connecting device which is more standardized than a printed circuit. This component-connecting device comprises stacked and assembled insulating wafers on which, on the faces oriented in a predetermined side of the stacking, substantially rectilinear and mutually parallel conductive tracks are formed, the tracks of two adjacent wafers being substantially perpendicular to one other. The pattern of the tracks on each wafer is therefore independent of the application of the device. This device, however, enables the making of various interconnections among components through its modularity: this device is capable of carrying a component and of being connected to other devices of the same type which are also capable of carrying a component. In effect, the device has zones for the connection of a component, located on that face, of the faces having tracks, which is free and the tracks of each wafer are extended on the edge of this wafer, thus forming connection zones with the exterior. The device further has connection means between the zones for the connection of a component and the tracks of the other faces.

More precisely, an object of the invention is a component-connecting device comprising:

a plurality of first stacked wafers, made of an electrically insulating material, each first wafer having a plurality of electricity conducting tracks, substantially rectilinear and substantially parallel to one another, made on a first of its faces, all the said first faces of the first wafers being oriented towards the same side, and the conductive tracks of two first adjacent wafers being substantially perpendicular;

means for the mechanical assembly of the first wafers, on that face, of the first faces, which is free, zones for the connection of a component;

means for electrical connection between, on the one hand, tracks belonging to said first faces which are not free and, on the other hand, said zones for the connection of a component;

on the edge of each of the wafers, connection zones with the exterior located in the extension of said conductive tracks.

The invention also concerns a functional module comprising a plurality of component-connecting devices such as this.

BRIEF DESCRIPTION OF THE DRAWINGS

Specific details, particular features and different embodiments of the invention will appear in the course of the following description, with the help of the appended figures, of which:

FIG. 2 shows the device of FIG. 1 associated with the component that is connected to it;

FIG. 3 shows a first section of an embodiment of a functional module according to the invention;

FIG. 4 shows a second section of the device of FIG. 3.

DESCRIPTION OF THE PREFERRED EMBODIMENTS

Figure 1:
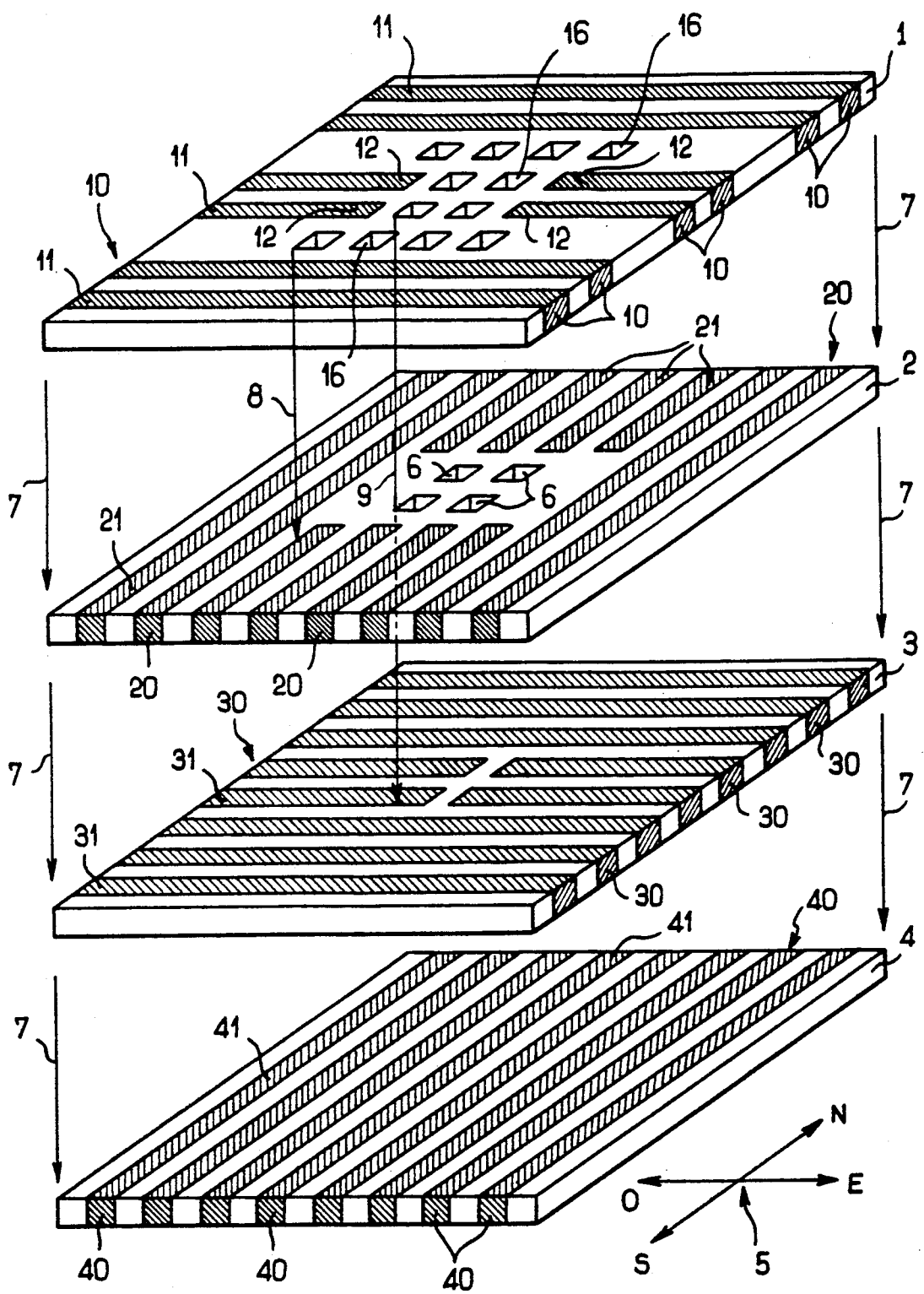
FIG. 1 shows an embodiment of a component-connecting device according to the invention, shown separately.

In these different figures, firstly, true scale has not been complied with and, secondly, the same references refer to the same elements.

FIG. 1 gives an exploded view, as shown by the arrows 7, of a first component-connecting device according to the invention.

This device has four stacked, electrically insulating wafers 1, 2, 3 and 4, on each of which electricity-conducting tracks 11, 21, 31 and 41 are made, for example by silk-screen process. These tracks are located on those faces of the wafers 1, 2, 3 and 4 that are oriented towards a given side, such as for example towards the top of the device. In FIG. 1 the top is located on the wafer 1 side. The tracks of a wafer are substantially rectilinear and parallel to one another.

The tracks of two adjacent wafers are substantially perpendicular. In a geographical reference system 5 having the four cardinal points, the tracks 11 and 31 of the wafers 1 and 3 are, for example, oriented in the East-West (E/W) direction; the tracks 21 and 41 of the wafers 2 and 4 are then oriented in the North-South (N/S) direction. Holes 6, substantially perpendicular to the stacking of the wafers, connect tracks belonging to the wafers 2, 3 or 4 to zones of the free face of the wafer 1, as shown schematically by the arrows 8 and 9. In FIG. 1, eight holes connect tracks of the wafer 2 to the wafer 1 (which is what the arrow 8 shows) and four holes connect tracks of the wafer 3 to the wafer 1 (which is what the arrow 9 shows).

The device of FIG. 1 is designed to receive, on the wafer 1 side, a component with connection zones that are, for example, arranged in a substantially regular grid Q. To this effect, the wafer 1 has either ends 12 of tracks 11 or ends 16 of holes 6 placed substantially in the same grid Q. These ends 12 or 16 or tracks or holes form zones for the connection of a component which are, for example, soldered to the connection zones of the component. To this effect, the holes 6 are, for example, filled with an electricity conducting material (such as, for example, a metal), the surfaces of these filled holes thus forming the ends 16 of the holes 6.

The grid Q of the zones for the connection of a component of the device fixes the number and the distribution of the tracks of the wafer 1 which are connected to ends 12 and tracks of the other wafers which are connected to holes 6. The number and distribution of the other tracks depends on the application of the device.

The filling of the holes 6 with an electricity conducting material further achieves a function of mechanical assembly of the wafers which are electrically connected to the free face of the wafer 1. In the case of FIG. 1, a filling such as this assembles the wafers 1, 2 and 3. The wafers that are not connected to the free face of the wafer 1, like the wafer 4 of FIG. 1, are joined to the other wafers, for example by bonding.

The filling of the holes 6 also provides for a removal of heat from within the device.

Furthermore, to connect the device of FIG. 1 with the exterior, for example with other analog devices which are themselves also capable of bearing other components, the tracks of each of the wafers is extended on to the edge of these wafers in zones, hereinafter called zones of connection with the exterior and referenced 10, 20, 30 and 40.

The device of FIG. 1 thus provides for a transmission of signals between said zones for the connection of a component located on the free face of the wafer 1 (namely the ends 12 of tracks 11 or the ends 16 of holes 6) and the zones of connection with the exterior (i.e. the extensions of the tracks on the edge of the wafers) which are oriented towards the North, South, East or West of the device in the geographical reference system 5. In the example illustrated in FIG. 1, the device has sixteen connection zones, of which:

two are connected to the East and emerge by the wafer 1;

two are connected to the West and emerge by the wafer 1;

four are connected to the North and emerge by the wafer 2;

four are connected to the South and emerge by the wafer 2;

two are connected to the East and emerge by the wafer 3;

two are connected to the West and emerge by the wafer 3;

The wafer 4 of the device of FIG. 1 enables a "direct" transmission of signals, namely transmission without going through the component connected to the device in the manner described earlier: the device is, in effect, designed to be inserted in a set, for example in a functional module as shall be described hereinafter, and it may be necessary to make tracks 40 that go directly through the device. The number of wafers of the device therefore depends on the application of this device.

FIG. 2 gives a more precise illustration of the working of the device of FIG. 1. This figure, in effect, shows the device of FIG. 1 assembled, as well as a component 50, shown at a distance from the connection device as indicated by the dashes. Owing to the respective sizes of the connection zones (not shown in FIG. 2) of the component 50 and of the zones 12 and 16, (described earlier) for the connection of the connection device, it may prove to be necessary to interpose interconnection and fixing means 60 between the component 50 and the connection device. This is the case, in particular, when the component is an integrated circuit. The minuteness of fabrication of the contacts of the integrated circuit is then appreciably greater than that which can be achieved when making a connection device according to the invention.

These interconnection and fixing means 60 are, for example, formed by a wafer with its two faces 65 and 61 respectively located against the face 56 of the component which has connection zones and against the free face of the wafer 1. These two faces 65 and 61 each have connection zones (not shown in FIG. 2) made with a minuteness of fabrication that is in between that of the connection zones of the component and that of the ends 12 of the tracks 11 or the ends 16 of holes 6. The connection zones of the faces 65 and 61 are electrically connected by channels going through the wafer 60. Preferably, at least one part of these channels provides for a shift that is substantially parallel to the faces 65 and 61. Furthermore, the connection zones of the faces 65 and 61 are, for example, respectively soldered to that of the component 50 and to the ends 12 or 16 of tracks 11 or holes 6, thus further providing for a mechanical fixing between the component 50, the wafer 60 and the connecting device.

According to a preferred embodiment, the interconnection and fixing means 60 are formed by a known interconnection device such as the one described in the French patent application filed on 13th July 1988 under the number 88 09547: the faces 65 and 61 shown in FIG. 2 are then, respectively, the first face and the second face of the first variant (comprising a wafer) of the known interconnection device, or else the first face of the first wafer and the second face of the nth wafer of the second variant (comprising n wafers) of the known interconnection device.

Signals may therefore be transmitted in the directions indicated by the arrows 100 between the component 50 and the exterior, or else go directly through the component, as explained earlier, in the direction indicated by the arrows 200, that is, in the example of FIGS. 1 and 2, in the North-South direction.

FIGS. 3 and 4 respectively show a first sectional view and a second sectional view of an embodiment of a functional module according to the invention, comprising a plurality of connection devices according to the invention such as, for example, that of FIGS. 1 and 2. The sectional plane of FIG. 4 is indicated in FIG. 3 by the arrows A—A. Reciprocally, th sectional plane of FIG. 3 is referenced by the arrows B—B in FIG. 4. FIGS. 3 and 4 are described simultaneously.

The functional module described has, for example, twelve connection devices 91. A component 50 is connected and fixed to each connection device, for example by interconnection and fixing means 60 such as those mentioned in the description of FIG. 3.

The connection devices 91 are juxtaposed at the bottom of a casing 81 of which one side wall 71 is formed, for example, by a connector capable of providing for an electrical link with the exterior. The casing also contains the components 50 and the interconnection and fixing means 60. It has a lid 72 formed, for example, by a plate of a heat-conducting material, hereinafter called a cold plate. This plate fulfils a function of removing heat from the functional module and of rigidifying this functional module. The edges of the connection devices 91 are kept in contact with one another by compression means 92 that have, for example, springs and are known per se.

According to a preferred embodiment, the components 50 are substantially square-shaped wafers. The interconnection means 60 and the connection devices 91 are also substantially square-shaped. The dimensions of the components 50 are substantially the same as those of the interconnection means 60 and are smaller than those of the connection devices 91. Spaces 93 are thus left free within the casing. Some of these free spaces 93 may be used, for example, to house channels within which there flows a heat transfer fluid. These channels are preferably in contact with the cold plate 72 and make for more efficient removal of heat from the functional module. In order to remove even more heat, it is further possible to spread a heat-conducting material in the free spaces that contain no channels 93. In this case, the cold plate 72 closes the functional module imperviously.

By way of an example, the components 50 are integrated circuits and each of them is connected to a capacitor 51 fulfilling a decoupling function such as, for example, a multiple-layer capacitor, known per se by those skilled in the art. A capacitor 51 such as this is, for example, a substantially square-shaped wafer and preferably has substantially the same dimensions as the integrated circuit 50. The capacitor 51 is placed in the casing 81 against the face 57 of the integrated circuit 50 (which is opposite the face 56 bearing connection zones and located against the interconnection and fixing means 60). The capacitor 51 and the integrated circuit 50 are, for example, interconnected and fixed in the manner described in the French patent application No. 88 14413 filed on 4th Nov. 1988.

What is claimed is:

1. A component-connecting device comprising:
   a plurality of components;
   a plurality of identical standardized generally square-shaped component-connecting devices with first and second square surfaces, and four edge surfaces, each edge surface having electrical connections, each component-connecting device being constituted of a plurality of first stacked wafers, made of an electrically insulating material, each first wafer having on a first of its faces a plurality of electricity conducting tracks, rectilinear and parallel to one another, all the first faces of the first wafers being oriented towards the same side, and the conductive tracks of two first adjacent wafers being perpendicular;
   each of said first wafers having on its edge electricity conducting connection zones with the exterior located only in the extension of said conductive tracks, said edge connection zones being in form on thin electricity conducting layers;
   each of said component-connecting devices having on said first square surface, zones for the connection of at most one of said components, and means for interconnection and fixing between said components and said component-connecting devices;
   said component-connecting devices being juxtaposed with each other, the first square surfaces of the component-connecting devices being parallel, the component-connecting devices being displaced from one another so that they contact one another only along edge surfaces, said component-connecting devices being interconnected with each other through electrical contact of said edge connection zones
   said module including means for pressing edge connection zones of each component-connecting device against edge connection zones of adjacent component-connecting devices, whereby edge connection zones of adjacent component-connecting devices are pressed together.

2. A component-connecting device according to claim 1, wherein said connection zones for the connection of at most one of said components comprises ends of conducting tracks located on said first square surface.

3. A component-connecting device according to claim 2, wherein said holes filled with an electricity conducting material provide mechanical assembly of the first wafers adjacent to said holes.

4. A component-connecting device according to claim 1, wherein said interconnection and fixing means comprise at least one second wafer, said second wafer having a first face which is against that face of the faces of the component which has connection zones, said first face of said second wafer comprises first connection zones located so as to face connection zones of the component, said second wafer having a second face which is located against that face of the first faces of the component-connecting device which is free, said second face has second connection zones located so as to face the zones for the connection of a component of the component-connecting device, said first and second connection zones of said second wafer being electrically connected by channels providing at least partially for a shift in position of electrically connected zones on said first and second faces which is substantially parallel to said faces of said second wafer and having a minuteness of fabrication that is in between that of the connection zones of the component and that of the zones for the connection of a component of said component-connecting device.

5. A component-connecting device according to claim 4, wherein the dimensions of the faces of the second wafer and those of the component substantially parallel to the faces of the second wafer are smaller than those of said first wafers of the connection device, thus creating free spaces in the casing.

6. A component-connecting device according to claim 5, wherein said interconnection and fixing means further have solderings made between said first connection zones of said second wafer and the connection zones of the component and between said second interconnection zones of said second wafer and the zones for the connection of a component of the connection device.

7. A component-connecting device according to claim 1, wherein said module further comprises cooling means.

8. A component-connecting device according to claim 7, wherein said cooling means comprise a cold plate forming one of the walls of the casing.

9. A component-connecting device according to claim 8, wherein said cooling means include channels made in said free spaces and within which a heat transfer fluid flows.

10. A component-connecting device according to claim 7, wherein said cooling means include a heat conducting and electrically insulating material spread in the casing around component-connecting devices of the components and said interconnection and fixing means.

11. A component-connecting device according to claim 1, wherein each component is an integrated circuit and wherein said module further has a plurality of capacitors fulfilling a decoupling function for said integrated circuits, one capacitor being connected and fixed to each of the integrated circuits.

12. A component-connecting device according to claim 1, wherein at least some of said first stacked wafers have ends of tracks located on the first square surfaces.

13. A component-connecting device according to claim 1, wherein at least some of said first wafers have holes to be filled with an electricity conducting material so as to provide connection between tracks belonging to said first faces of the first wafers.

14. A component-connecting device according to claim 1, wherein said first wafers which are not assembled to each other by an electricity conducting material are assembled to each other with a bonding material.

15. A component-connecting device according to claim 1, wherein said tracks are narrow bands on said first faces of the first wafers which are then electricity conducting layers such as in printed circuits.

16. A component-connecting device according to claim 1, wherein said means of mechanical assembly comprise:
a casing having the said component-connecting devices juxtaposed at its bottom and containing the components and the interconnection and fixing means;
compression means providing for a contact between the edges of the juxtaposed component-connecting devices.

17. A component-connecting device constituting a module according to any of the claims 2, 1, and 3-16.

18. A component-connecting module comprising:
a plurality of components;
a plurality of identical standardized generally square-shaped component-connecting devices, all the component-connecting devices having the same dimensions with first and second square surfaces, and four edge surfaces, each edge surface having electrical connections, each component-connecting device being constituted of a plurality of first stacked wafers, made of an electrically insulating material, each first wafer having on a first of its faces a plurality of electricity conducting tracks, rectilinear and parallel to one another, all the first faces of the first wafers being oriented towards the same side, and the conductive tracks of two first adjacent wafers being perpendicular;
each of said first wafers having on its edge electricity conducting connection zones with the exterior located only in the extension of said conductive tracks, said edge connection zones being in the form of thin electricity conducting layers;
each of said component-connecting devices having on said first square surface, zones for the connection of at most one of said components, and means for interconnection and fixing between said components and said component-connecting devices;
said component-connecting devices being juxtaposed with each other, the first square surfaces of the component-connecting devices being parallel, the component-connecting devices being displaced from one another so that they directly contact and electrically connect to one another only along edge surfaces, said component-connecting devices being interconnected with each other through electrical contact of said edge connection zones.

* * * * *